United States Patent [19]
Wheeler et al.

[11] Patent Number: 5,113,314
[45] Date of Patent: May 12, 1992

[54] HIGH-SPEED, HIGH-DENSITY CHIP MOUNTING

[75] Inventors: Richard L. Wheeler, San Jose; Voddarahalli K. Nagesh, Cupertino, both of Calif.

[73] Assignee: Hewlett-Packard Company, Palo Alto, Calif.

[21] Appl. No.: 645,913

[22] Filed: Jan. 24, 1991

[51] Int. Cl.$^5$ .............................................. H05K 7/20
[52] U.S. Cl. .................................... 361/384; 361/386; 361/400
[58] Field of Search ............... 361/383, 384, 386, 388, 361/400, 402–406, 411

[56] References Cited

U.S. PATENT DOCUMENTS

| | | | |
|---|---|---|---|
| 3,515,949 | 6/1970 | Michaels et al. | 361/394 |
| 3,899,719 | 8/1975 | Murphy | 361/405 |
| 4,059,849 | 11/1977 | Mitchell | 361/395 |
| 4,266,282 | 5/1981 | Henle et al. | 365/52 |
| 4,399,485 | 8/1983 | Wright et al. | 361/384 |
| 4,499,524 | 2/1985 | Shioleno | 361/404 |
| 4,507,710 | 3/1985 | Jung | 361/428 |
| 4,689,719 | 8/1987 | Prussas et al. | 361/386 |
| 4,730,238 | 3/1988 | Cook | 361/414 |
| 4,743,868 | 5/1988 | Katoh et al. | 333/12 |
| 4,785,533 | 11/1988 | Seino et al. | 29/827 |
| 4,807,087 | 2/1989 | Sawaya | 361/405 |
| 4,894,751 | 1/1990 | Wehnelt | 361/398 |
| 4,922,378 | 5/1990 | Malhi et al. | 361/387 |
| 5,050,039 | 9/1991 | Edfors | 361/388 |

OTHER PUBLICATIONS

Michael Leibowitz; "The Computer Speed Barrier," *Technology Review,* Aug./Sep. 1990 pp. 14–15.

*Primary Examiner*—Gregory D. Thompson

[57] ABSTRACT

An electronic component assembly and method for enhancing density and operational speed. The assembly includes a plurality of integrated circuit chips which are mounted to a planar surface of a substrate, preferably a printed circuit board, with the opposed major faces of the chips being perpendicular to the planar surface. One of the major faces of each chip is the active face having a pattern of signal pads. The pads are disposed along the face periphery adjacent to the edge of the chip contacting the printed circuit board. The signal pads have solder bumps which can be soldered directly to contact pads on the printed circuit board. A passivating edge-coating on each chip protects the chip and prevents electrical shorting on the printed circuit board. A source of fluid directs a cooling flow along the large area major surfaces of the chips.

12 Claims, 2 Drawing Sheets

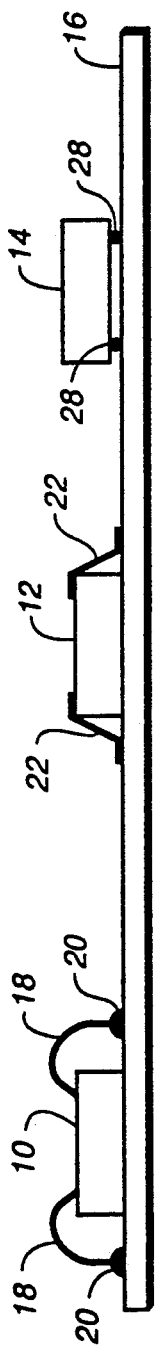
FIG._1
*(PRIOR ART)*
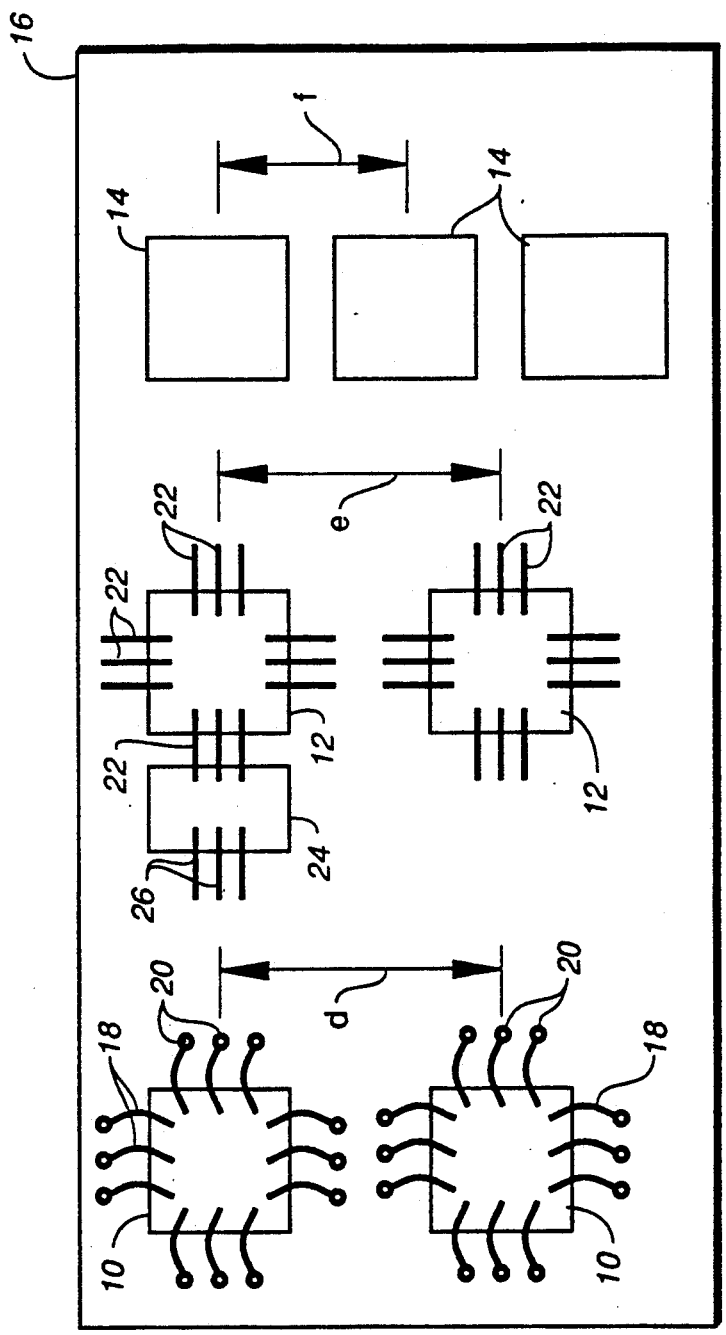
FIG._2
*(PRIOR ART)*

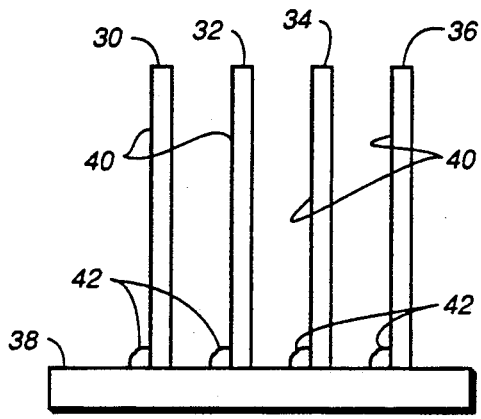
FIG._3
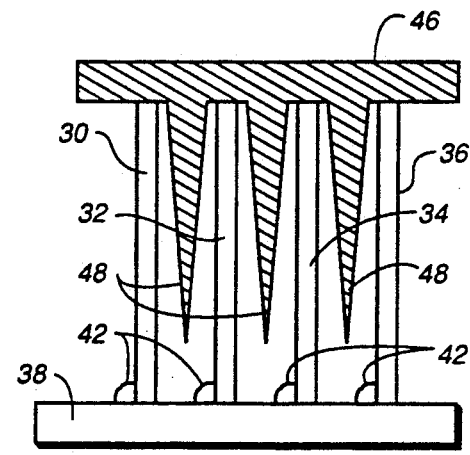
FIG._5
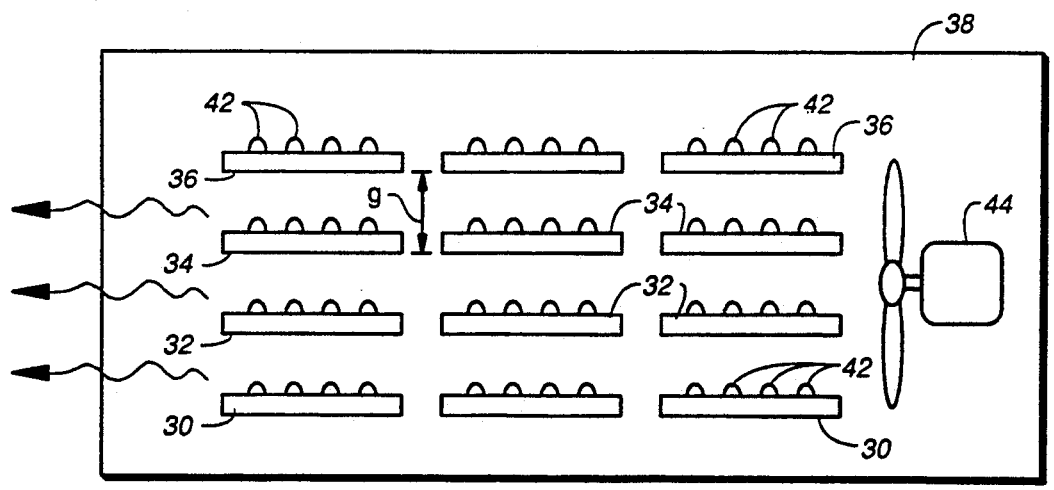
FIG._4

HIGH-SPEED, HIGH-DENSITY CHIP MOUNTING

TECHNICAL FIELD

The present invention relates generally to electronic components and more particularly to the interconnection of integrated circuit chips.

BACKGROUND ART

Typically, a goal in the manufacturing of electronic components and in the design of printed circuit board placement of the electronic components is to minimize the height of the devices above the surface of the printed circuit board. This allows printed circuit boards in an electronic assembly to be mounted in closely spaced side-by-side relation. Thus, it is standard to mount the large area surfaces of the electronic components parallel to the printed circuit board surface. Flat-pack components and surface mount components aid in minimizing the maximum height of a printed circuit board.

One difficulty with the aim of achieving high printed circuit board density involves the electrical communication between the boards. Conducting signals from one board to another requires a relatively long signal path. This is detrimental to low-inductance, high-speed operation of circuitry.

Moreover, low profile design of electronic components sometimes works against miniaturization. At times printed circuit boards do not need to be closely spaced. In fact, many electronic assemblies require only a single printed circuit board. In these applications mounting electronic components parallel to the printed circuit board limits the number of components that can be mounted on a particular board.

Devices and methods for achieving a higher component density on a given amount of circuit board surface area are known. Cook U.S. Pat. No. 4,730,238 teaches a double sided mounting module for surface mount integrated circuit packages. The packages are connected to opposite sides of the module in a conventional manner. The module is then soldered to a printed circuit board so that the module and the packages extend vertically from the board. Murphy U.S. Pat. No. 3,899,719 teaches a dual in-line package and terminal having bent leads which allow the package to be mounted vertically from a horizontal printed circuit board. The inventions of Cook and Murphy provide an improvement in the use of a given amount of printed circuit board surface area, but the packaging and the intermediate printed circuit boards require a routing of signal lines that is less than optimal. Reduction of the length of signal lines enhances the speed and performance of circuitry. The vertical extensions of the signal lines taught by Cook and Murphy elongate the signal lines.

It is an object of the present invention to provide an electronic component which may be attached directly to a conventional printed circuit board or other substrate in a manner which both reduces the required board surface area and increases the speed and performance of the overall circuit.

SUMMARY OF THE INVENTION

The above object has been met by an electronic component, preferably an integrated circuit chip, which is adapted for mounting along a small area substrate-attachment edge, with a large area active side of the component being soldered to a printed circuit board adjacent to the substrate-attachment edge. The integrated circuit chip may include an edge coating of passivating material, but preferably is not encased within a chip package that would require an increase in the length of signal lines.

A plurality of the integrated circuit chips are mounted to a planar surface of the printed circuit board or other substrate, with opposed major faces of the chips being perpendicular to the planar surface. The dimension between the major faces is substantially less than the dimension between the substrate-attachment edge and the opposite edge. One of the major faces is an active surface having a pattern of signal pads adjacent to the substrate-attachment edge. The signal pads are arranged in a pattern corresponding to a pattern of contact pads on the printed circuit board. Using conventional solder bump technique, the signal pads of the chips are mechanically and electrically connected to the contact pads of the printed circuit board. The resulting assembly is one which is adapted for high chip density.

An advantage of the present invention is that it is able to take advantage of the three dimensional characteristics of interconnects. For many chips the total interconnect area of signal pads is small compared to the overall area of the active side of the chips. For example, this interconnect area on static and dynamic memory chips is less than one centimeter. The present invention provides for placement of all of the interconnects on one major side of the chip in a region that allows vertical mounting without use of an intermediate package. A passivation layer insulates each chip to prevent shorting along the printed circuit board. A cooling flow of air may be used to conduct thermal energy away from the chips. Alternatively, heat sinks or liquid cooling may be employed.

Another advantage of the present invention is that the shorter interconnections permit higher operating speeds. Moreover, the ultimate package can be produced less expensively, since there is a material savings in packaging and, possibly, in the size of the printed circuit board.

BRIEF DESCRIPTION OF THE DRAWINGS

FIG. 1 is a side diagrammatic view of three prior art techniques for attaching integrated circuit chips to a substrate.

FIG. 2 is a top diagrammatic view of the prior art interconnections of FIG. 1.

FIG. 3 is a side diagrammatic view of integrated circuit chips and an interconnect assembly in accord with the present invention.

FIG. 4 is a top diagrammatic view of the assembly of FIG. 3.

FIG. 5 is an alternate embodiment for conducting thermal energy from the assembly of FIG. 3.

BEST MODE FOR CARRYING OUT THE INVENTION

With reference to FIGS. 1 and 2, three prior art methods of interconnecting integrated circuit chips 10, 12 and 14 to a chip carrier 16, are shown. The chip carrier 16 may be a printed circuit board or a multi-chip module or the like. A first chip interconnection method is provided at integrated circuit chips 10. The method is referred to as wire bonding. Each signal pad on the chips 10 is provided with a wire 18 having an outer end that is soldered or welded to the carrier 16. Wire bonding can be performed with gold wire by thermal compression, ultrasonic or thermal sonic techniques, or with aluminum wire by the ultrasonic technique. The wires are shown as being wedge-ball bonded. That is, a wedge bond is utilized at the chip end of the wires, while a ball bond 20 is utilized at the carrier level. Often the wedge and ball bonds are reversed.

A tape automated bonding method is shown at integrated circuit chips 12. Tape automated bonding frames include inner leads of copper traces 22 connected to signal pads of the chips 12. The copper traces are supported by an insulating material similar to 35-mm film. The tape automated bonding frame is formed by coating the film with copper, whereafter the copper coating is subjected to conventional photolithography and etching to define the traces 22. The outer leads of the traces 22 are typically soldered or welded to contacts on the carrier 16. Alternatively, the tape automated bonding frame may be "demountable". Demountable tape automated bonding may include a compression cap 24 having conductive traces, not shown, that are aligned with the copper traces 22 and with contacts 26 on the carrier 16. Thus, pressure exerted on the compression cap will provide electrical communication between the copper traces of the frame and the carrier contacts 26 via the conductive traces on the compression cap. Demountable tape automated bonding allows easy replacement of defective tape automated bonded chips 12.

The integrated circuit chips 14 are fixed to the carrier 16 by a solder bump method. This method is sometimes referred to as flip-chip mounting, since the signal pads of the chip are faced downwardly onto the carrier 16. Solder bumps 28 are formed on each signal pad. The chips are placed face down on the carrier and the temperature is increased to cause the solder to reflow for direct bonding of the signal pads to contacts on the carrier.

The pitch "d" of the wire bonded chips 10 is generally equal to the pitch "e" of tape automated bonded chips 12. In both cases, the chips 10 and 12 must be spaced apart significantly to allow soldering of the wires 18 and the leads 22 to the carrier 16. The solder bump method of chips 14 permits a decrease in the pitch "f", since the signal pads of the chip are connected directly to the carrier. However, the large area surfaces of the chips 10, 12 and 14 are parallel to the carrier in all of the above-described methods.

FIGS. 3 and 4 illustrate an interconnection method which significantly reduces the necessary pitch "g" between integrated circuit chips 30, 32, 34 and 36. In the methods described above, the active face, i.e., the side having the signal pads, of a chip was either directed away from or toward the chip carrier. In the present invention, the active faces 40 of the IC chips 30-36 are perpendicular to the chip carrier 38. Thus, the chip density on a carrier 38 is greatly increased. This facilitates miniaturization of electronic assemblies.

Perhaps more importantly, the three dimensional interconnection method of FIGS. 3 and 4 may be used to enhance the speed and performance of the circuitry. In the wire bonding, tape automated bonding and flip-chip methods, the spacing between chips necessitates relatively long signal paths. This results in an increase of capacitance and inductance and in a decrease in performance and speed. The high density method of FIGS. 3 and 4 enhances performance and operational speed. The lengths of signal paths are minimized by fabricating the chips 30-36 in a manner that provides a pattern of signal pads along the periphery of the active face 40 of each chip that is adjacent to the interface of the chip to the carrier 38. By placing the signal pads along the periphery of the active face, the pads can be soldered to contact areas on the carrier 38 at solder connections 42.

The present invention therefore requires formation of the signal pads at the bottom end of the active face 40 of each chip 30-36. Typically, formation of the pads along a single row does not present spacing difficulties. For example, in standard random access memory chips (RAM) the total interconnect area is small compared to the overall area of the active face 40, e.g., less than 1 centimeter.

The chip fabrication process should include formation of solder bumps at the signal pads. The process sequence for making solder bumps is known. Electroplating gold to a height of approximately 25 microns provides adequate assurance of an effective electrical connection to solder bumps formed on the contacts of the chip carrier 38. The choice of metal and the method of forming solder bumps, however, are not critical to the present invention. Solder reflow may then be employed to provide the electrical connection. Electrical connection may alternatively be provided by welding or by a conductive glue joining individual signal pads to contact areas on the carrier 38. Use of a block having a metallization patter corresponding to the patterns of chip signal pads and carrier contacts has also been contemplated.

Preferably, the integrated circuit chips 30-36 are edge-coated with a passivating layer. This layer may be applied by dipping the chips in fluid epoxy or in a polyimide material. The edge-coating is separate from the conventional passivating coating of a processed semiconductor wafer. The edge-coating is applied after the wafer has been sliced into individual chips. The edge-coating reduces the risk of oxidation and, more importantly, provides insulation to prevent shorting of signal paths on the carrier 38 when the chips are brought into contact with the carrier.

While, as in the prior art methods, the chips 30-36 remain in contact with the carrier, the area of contact is substantially less than the prior art methods. Consequently less thermal energy will be conducted away from the chips by contact with the carrier 38. In some applications conduction cooling through the carrier is sufficient. In other applications a fan 44 may be utilized to direct a cooling flow of gas, preferably air, along the surfaces of the chips 30-36. Cooling of high heat-generating chips may be provided by substituting a flow of liquid coolant, such as freon.

Referring now to FIG. 5, an interdigitated heat sink 46 having downwardly depending fingers 48 may be used instead of the fan or in conjunction with the fan to control the temperature of the chips 30-36. While not shown in FIG. 5, preferably each finger 48 is in physical contact with the active face of one chip and with the rear face of an adjacent chip. The heat sink may have an internal flow path, not shown, for the passage of a liquid coolant. Alternatively, the liquid coolant may flow across the exterior of the heat sink.

We claim:
1. An assembly of electronic components comprising;
a dielectric substrate having a plurality of patterns of electrically conductive contacts on a planar surface thereof, and
a plurality of electronic components mounted to said planar substrate surface, each having opposed major faces and opposed minor edges, the dimension between said major faces being substantially less than the dimension between said opposed minor edges, one of said major faces of each component being an active surface having a pattern of signal pads proximate to a first of said minor edges, said first minor edge of each component fixed in contact with said planar substrate surface, said pattern of signal pads directly affixed to one of said patterns of contacts on said planar substrate surface, said first minor edge of each component having an edge coating of a passivation material, thereby providing an oxidation-resistant, electrically insulating layer at said first minor edge of each component.

2. The assembly of claim 1 wherein said patterns of signal pads are connected to said patterns of contacts on said planar substrate surface by solder bumps, said electronic components being integrated circuit chips.

3. The assembly of claim 2 wherein signal communication between said substrate and said chips is limited to conduction via said solder bumps.

4. The assembly of claim 1 further comprising cooling means for conducting thermal energy from said components.

5. The assembly of claim 4 wherein said cooling means is a source of fluid, said source directed to provide a cooling flow of said fluid along said plurality of electronic components.

6. The assembly of claim 4 wherein said cooling means is a heat sink positioned adjacent to said electronic components.

7. The assembly of claim 1 wherein said electronic components are integrated circuit chips, each chip having a passivating layer on each edge thereof.

8. A method of interconnecting a plurality of electronic components comprising, fabricating a plurality of integrated circuit chips so that each includes opposed large area major sides and a small area mounting side spacing apart corresponding extremities of said major sides, on said plurality of chips, forming a plurality of signal pads on a first of said major sides adjacent to said extremity of said first major side, coating said small area mounting side of said integrated circuit chips with a passivation material, providing a dielectric substrate having a planar surface having a plurality of patterns of conductive substrate pads, and affixing said mounting side of each chip parallel to said planar surface of said substrate by connecting said signal pads to said conductive substrate pads, thereby providing an assembly adapted for high chip density.

9. The method of claim 8 wherein said step of fabricating said chips includes cutting dies from semiconductor wafers and wherein said step of coating includes covering all edges of said dies with a passivation layer.

10. The method of claim 8 wherein said step of fabricating said chips includes forming solder bumps on said signal pads.

11. The method of claim 10 wherein said step of affixing said chips to said substrate includes soldering said solder bumps to said conductive substrate pads.

12. The method of claim 8 further comprising directing a cooling flow of fluid across chips mounted to said substrate.

* * * * *